United States Patent
Boday et al.

(10) Patent No.: US 9,617,385 B2
(45) Date of Patent: Apr. 11, 2017

(54) POLYHEXAHYDROTRIAZINE DIELECTRICS

(71) Applicant: International Business Machines Corporation, Armonk, NY (US)

(72) Inventors: Dylan J. Boday, Tucson, AZ (US);
Jeannette M. Garcia, San Jose, CA (US); James L. Hedrick, Pleasanton, CA (US); Rudy J. Wojtecki, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/885,759

(22) Filed: Oct. 16, 2015

(65) Prior Publication Data

US 2016/0300644 A1    Oct. 13, 2016

Related U.S. Application Data

(63) Continuation of application No. 14/680,181, filed on Apr. 7, 2015.

(51) Int. Cl.

| C08G 8/16 | (2006.01) |
| C08G 73/06 | (2006.01) |
| H01B 1/12 | (2006.01) |
| C08J 5/24 | (2006.01) |
| D06M 15/37 | (2006.01) |
| H01B 13/00 | (2006.01) |
| H01L 23/522 | (2006.01) |

(52) U.S. Cl.
CPC ............ *C08G 73/0644* (2013.01); *C08J 5/24* (2013.01); *D06M 15/37* (2013.01); *H01B 1/128* (2013.01); *H01B 13/0026* (2013.01); *H01L 23/5226* (2013.01); *C08J 2379/04* (2013.01); *H05K 2201/0137* (2013.01)

(58) Field of Classification Search
CPC .................. H01L 51/0067; H01L 51/0072
See application file for complete search history.

(56) References Cited

U.S. PATENT DOCUMENTS

| 5,102,970 A | 4/1992 | Wang |
| 5,268,193 A | 12/1993 | Beuhler et al. |
| 5,336,925 A | 8/1994 | Moss et al. |
| 5,840,369 A | 11/1998 | Maruta et al. |

(Continued)

FOREIGN PATENT DOCUMENTS

WO    2015/123329 A1    8/2015

OTHER PUBLICATIONS

Hiller et al., Mat. Res. Innovat (2002) 6:179-184.*

(Continued)

*Primary Examiner* — Shane Fang
(74) *Attorney, Agent, or Firm* — Patterson & Sheridan, LLP

(57) ABSTRACT

Low dielectric constant (low-k) polyhemiaminal (PHA) and polyhexahydrotriazine (PHT) materials with cyclic aliphatic ring structures are described. The materials are formed by a method that includes heating a mixture comprising amines and paraformaldehyde. The reaction mixtures may be used to form low-k PHT prepregs, composites and dielectrics used in integrated circuits.

14 Claims, 2 Drawing Sheets

(56) References Cited

U.S. PATENT DOCUMENTS

| | | | |
|---|---|---|---|
| 5,976,710 A | 11/1999 | Sachdev et al. | |
| 6,605,353 B2 | 8/2003 | Okada et al. | |
| 7,026,032 B2 | 4/2006 | Lee et al. | |
| 7,351,784 B2 | 4/2008 | Lehman, Jr. | |
| 7,504,460 B2 | 3/2009 | Basheer et al. | |
| 9,243,107 B2* | 1/2016 | Hedrick | C08G 65/00 |
| 2016/0152320 A1* | 6/2016 | Kling | B64C 11/14 60/722 |

OTHER PUBLICATIONS

International Business Machines Corporation, "List of IBM Patents or Patent Applications Treated as Related," Oct. 19, 2015, 2 pages.

\* cited by examiner

POLYHEXAHYDROTRIAZINE DIELECTRICS

CROSS-REFERENCE TO RELATED APPLICATIONS

This application is a continuation of co-pending U.S. patent application Ser. No. 14/680,181, filed Apr. 7, 2015. The aforementioned related patent application is herein incorporated by reference in its entirety.

FIELD

The present invention relates to improving the physical and electrical properties of polyhexahydrotriazine (PHT) polymers and networks, and more specifically to new low dielectric constant (low-k) polyhexahydrotriazines (PHTs) for application in the field of electronics.

BACKGROUND

As device dimensions decrease and device densities increase, chip performance degrades due to signal delays and cross talk between the conductor lines. Signal propagation delays are characterized by the product of metal resistance (R) times the capacitance (C) of the lines (RC delay), which has the dimension of time in seconds. The RC delay depends on the resistivity of the wiring metallurgy, the dielectric constant(s) of the insulating media, and the dimensions and configuration of the metal lines. The relatively recent change in metallurgy from aluminum to copper has reduced the resistivity of the metal by about 30%, providing a significant improvement in performance. However, the RC delay phenomenon is exacerbated by the high polarizability of conventionally integrated $SiO_2$ (k~4) dielectric and the need to keep conductor lines as short as possible. While the switch to copper metallurgy and new multilevel wiring schemes have ameliorated the RC delay problem, as feature sizes go below 0.25 µm, this alone will not provide a solution.

The use of an insulator with a dielectric constant (k) lower than $SiO_2$ would reduce parasitic capacitance and crosstalk, but it must still meet a number of stringent integration requirements including: thermal stability ≥400° C., resistance to crack generation and propagation, low defect density, low water uptake, chemical resistance, processability by photolithographic techniques and gas-phase etching, as well as a capacity for chemical mechanical planarization (CMP). Inorganic insulators may satisfy most of these requirements, however, extendibility to future device generations requires the introduction of porosity (e.g., k=1 for air) to lower the dielectric constant.

Porous low-k materials have been introduced for use in specialty ICs over the last several years. The porous materials exhibit dielectric constants from about 2.5 to about 3.0, but unfortunately exhibit low-moduli, are prone to cracking, and mostly contain interconnected pores, which makes subsequent processing steps such as electroplating and CMP more difficult. Because of these drawbacks, there is a need for fully dense materials, such as low-k PHTs, with improved properties that do not suffer from the disadvantages of porous low-k materials in IC applications.

New generation printed circuit boards (PCBs) used in high speed (>2 Gb/s) telecommunication equipment and internet infrastructure servers face a similar challenge as ICs due to decreasing device and substrate dimensions. PCBs increasingly put more function in a smaller space, which requires more components, while utilizing smaller bond pads, smaller lines and tighter pitch. The shrinking form factors combined with the future integration of optical signal transmission in 3D packaging schemes has driven the need for lower dielectric constant printed circuit board substrates. Because of the new PCB challenges, it would be an advantage to replace high k epoxy matrix resins used in PCBs (e.g., FR-4 type), with new low-K PHTs to reduce crosstalk and parasitic capacitance.

SUMMARY

Low-k PHA and PHT materials with cyclic aliphatic ring structures are described. The materials are formed by a method that includes heating a mixture comprising amines and paraformaldehyde. The reaction mixtures may be used to form low-k PHT prepregs, composites and dielectrics used in integrated circuits. Specifically, embodiments of the disclosure include a PHT comprising a plurality of trivalent hexahydrotriazine groups having the structure

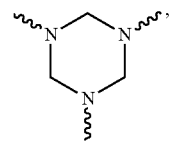

and a plurality of carbon groups having the structure

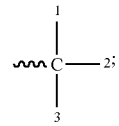

and
wherein each wavy bond site of a given hexahydrotriazine group is covalently linked at a respective wavy bond site of a carbon group, and each wavy bond site of a given carbon group is covalently linked at a respective wavy bond site of a hexahydrotriazine group, and wherein at least one of 1, 2, and 3 comprises a chemical group that is a cyclic carbon chemical group, or 1 and 2 can be part of an cyclic carbon chemical group, or 2 and 3 can be part of an cyclic carbon chemical group, or 1 and 3 can be part of an cyclic carbon chemical group. PHTs herein are described wherein at least one of 1, 2, and 3 is a covalently bonded carbon substituent, and wherein at least one of 1, 2, and 3 comprises a covalently bonded cyclic aliphatic chemical group, and wherein at least one cyclic aliphatic chemical group comprises at least one cyclic carbon ring, and more specifically, wherein at least one cyclic carbon ring is fused to at least one other cyclic carbon ring. Also described are PHTs wherein at least one of 1, 2, and 3 covalently bonds at least one hexahydrotriazine group to another hexahydrotriazine group. The PHTs of the disclosure may further comprise at least 50% by mole aliphatic carbon-carbon chemical bonds based on polymer, and comprising at least 50% by mole cyclic aliphatic carbon-carbon chemical bonds based on polymer. PHTs of the disclosure are also described comprising less than 50% by mole aromatic carbon-carbon chemical bonds based on polymer. In some embodiments, PHTs comprising covalently bonded fluorine atoms, cyclic chemical groups that contain covalently bonded fluorine atoms are described. The PHTs of the disclosure exhibit a dielectric constant that is less than 5, and a dielectric constant that is at least 1.8. Embodiments of the disclosure elucidate a method of producing a composite article, comprising: forming a mixture comprising a solvent, amines, and paraformaldehyde, and; heating the mixture to a first temperature to produce a first partially cured mixture of a first viscosity; coating a work piece with the first partially cured mixture of the first viscosity to produce polymer impregnated fibers (prepreg); heating the prepreg to a second temperature to produce a B-stage prepreg of a second viscosity; cooling the B-stage prepreg; forming an article from the B-stage prepreg; and heating the article at a temperature from about 150° C. to about 280° C. to form a fully cured composite containing polyhexahydrotriazine. In some embodiments of the method, the amines of the mixture comprise at least 50% by mole cyclic aliphatic amine based on polymer and the amines of the mixture comprise of less than 50% by mole aromatic amine based on polymer. The method further describes a first partially cured mixture of the first viscosity is produced at a temperature from about 20° C. to about 40° C., and wherein the first partially cured mixture of the first viscosity comprises covalently bonded cyclic aliphatic chemical groups and PHA oligomers and polymers. In some embodiments, the B-stage prepreg of the second viscosity is produced at a temperature from about 40° C. to about 145° C., wherein the B-stage prepreg of the second viscosity comprises covalently bonded cyclic aliphatic chemical groups and PHA oligomers and polymers. A composite article produced by the method is a printed circuit board.

BRIEF DESCRIPTION OF THE FIGURES AND DRAWINGS

So that the manner in which the above recited features of the present disclosure can be understood in detail, a more particular description of the disclosure, briefly summarized above, may be had by reference to embodiments, some of which are illustrated in the appended drawings and in the body of the specification. It is to be noted, however, that the appended and embedded drawings illustrate only typical embodiments of this disclosure and are therefore not to be considered limiting of its scope, for the disclosure may admit to other equally effective embodiments.

Figure 1:
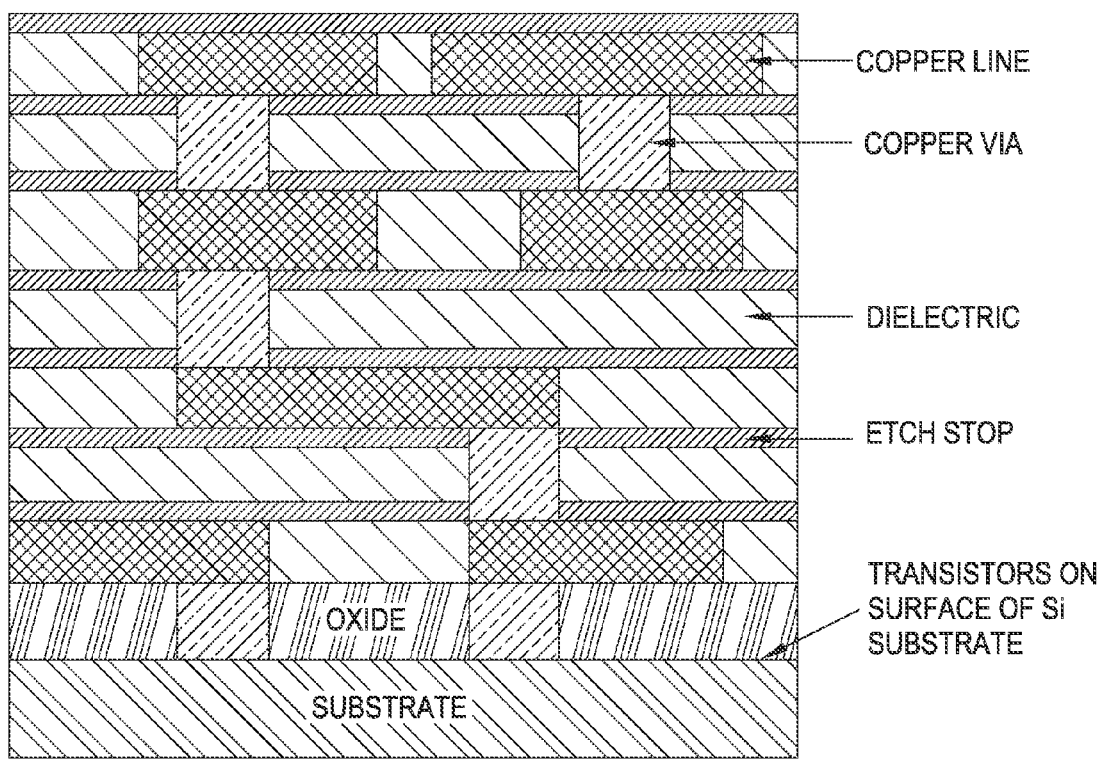
FIG. 1 is a cross sectional view of a multilevel interconnect scheme for an IC according to one embodiment of the disclosure.

To facilitate understanding, identical reference numerals have been used, where possible, to designate identical elements that are common to the figures and drawings. It is contemplated that elements disclosed in one embodiment may be beneficially utilized on other embodiments without specific recitation.

DETAILED DESCRIPTION

To solve the RC delay issues in both ICs and PCBs, new low-k PHT materials and methods for their preparation are presented in the disclosure, whereby cyclic aliphatic chemical groups enhance the physical and electrical properties of the PHTs, and enable their use in electronic applications. The overall dielectric constant of an article or composite, comprising multiple materials or components, is the weighted sum of the dielectric constants of all the materials or components that make up the article or composite. The dielectric constant of an article, composite or bulk material is derived from the frequency dependent sum total of the polarizability derived from molecular structure, chemical groups and chemical bonds, which make electronic, ionic and polar contributions. In the case of aromatic PHTs, the electronic component or contribution to polarizability refers to the oscillation of electrons in the chemical bonds (both sigma and pi) in the extended supramolecular structure. Therefore, in low-k material design, it is desirable to minimize or eliminate ionic and polar contributions, and polarizable pi electrons. One example of such a low-k material suitable for electronic applications is a new low-k PHT comprising cyclic aliphatic chemical groups that lack pi electrons. Advantageously, new cyclic aliphatic low-k PHTs may be produced without additional solvent from commercially available reagents such as cycloaliphatic diamines such as 1,4-diaminocyclohexane (DCH) and paraformaldehyde (PF), as shown reaction example 1.

Reaction Example 1

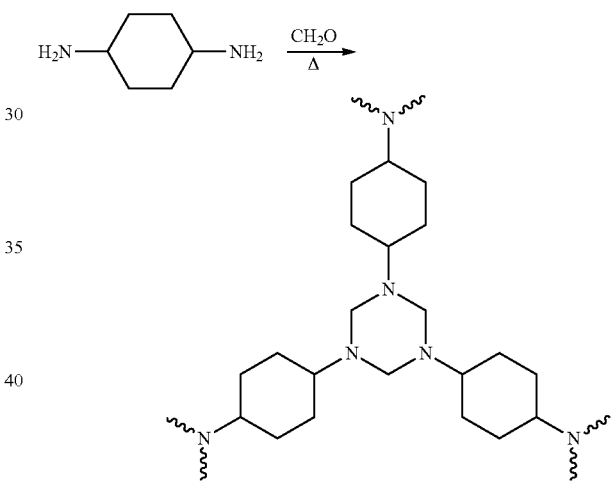

Per reaction example 1, and in other embodiments, the amine(s) may serve as a reaction mixture solvent and/or a co-solvent, which may save additional steps involving solvent removal and disposal. General conditions for PHT formation, such as that shown in reaction example 1, involve combining PF and amines in a dry and degassed vessel, wherein the PF and amines may be in a ratio of about 1.25 mole PF:0.5 mole amine. The well stirred reaction mixture may then be heated from about 30° C. and about 50° C. to cause the reaction of the aliphatic amine with PF, and thus produce a PHA material over a time period from about 0.5 hours to about 2 hours. In some embodiments a PHT film may be produced by casting or spin coating an aliquot of the reaction mixture solution onto a substrate, followed by heating to about 200° C. for about 1 hour, and then soaking the film at 200° C. for about 1 hour, followed by cooling to ~23° C. Further details regarding PHT production are provided later in the disclosure.

We note here that chemical reaction examples in the disclosure, such as reaction example 1, may have non-limiting symbols used in the chemical arts such as chemical formulas, equations, a triangle under an arrow which serves an abbreviation to indicate a heating of the reaction mixture, and wavy or squiggly lines attached to an atom in a chemical formula that represent a chemical bond between that atom and another atom or chemical structure not shown in the formula. Further, the chemical structure indicated by use of a wavy line may be a recurring chemical structure, such as a polymer, a quasi-recurring chemical structure, such as a polymer with varying monomer and bridge units, or a non-recurring chemical structure, such as a terminating group.

Those skilled in the art will appreciate that the cycloaliphatic diamine, DCH, as shown in reaction example 1, is non-limiting component in the preparation of low-k PHTs. In general, the practitioner may choose any small molecule, oligomer, or polymer comprising multifunctional amines, aliphatic amines, cyclic amines and optionally some mole fraction of aromatic amine(s) in a low-k PHT synthesis. The amines may have mono, di, tri, tetra, or penta amine functionality. The aliphatic amine may also have one or more aliphatic amine groups, which may be primary and/or secondary, or mixtures thereof. Aliphatic and aromatic ring structures comprising amine chemical groups may be monocyclic or polycyclic, and may further comprise fused rings and pendant rings. "Fused rings" refers to two ring chemical structures that share at least two atoms. In other words, a ring structure A and a ring structure B form a fused ring structure if A and B share at least two atoms. The number of carbon atoms in the ring structures are not restricted, but we note that carbon rings comprising less than 5 carbon atoms may be more prone to bond scission than ring structures with 5 carbon atoms or more. For example, cyclobutane is more prone to thermal bond scission than cyclopentane. The cyclic chemical structures below illustrate some possible positions of amine groups on aliphatic ring structures. As shown below, a decalin molecule may have the ring carbon atoms numbered 1-10, and amine groups may be attached to at least one of these positions, for example, the diamine shown below, 5, 10-diamino-decahydronaphthalene.

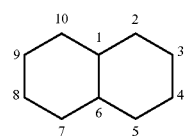

Decalin

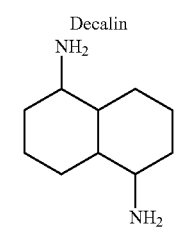

5, 10-diamino-decahydronaphthalene

We note that the position of the amine group on the ring(s) (e.g., axial position versus equatorial position), the ring(s) conformation, and resultant torsional strains and steric interactions may affect the bulk physical properties of the PHT such as Tg, modulus and flexibility. Notably, by judicious choice of ring structure, amine group positions, and number of carbon atoms, the bulk polymer physical properties may be modified as needed. Cyclic aliphatic amines and cyclic structures that comprise low-k PHTs may also provide a high modulus network without the inherent brittleness found in highly aromatic systems, and do not contain lossy pi electrons which increase the dielectric constant. Further, cyclic aliphatic polymers, in comparison to linear polymers, have less bond rotation and thus are more rigid, and thus may feature higher glass transition temperatures (Tg), increased thermal stability, and higher modulus, while still maintaining some flexibility.

In another embodiment, a low-k PHT comprising bulky polycyclic adamantyl rings may be produced by reacting 1,3-adamantanediamine and it's isomers with PF, as shown in reaction example 2:

Reaction Example 2

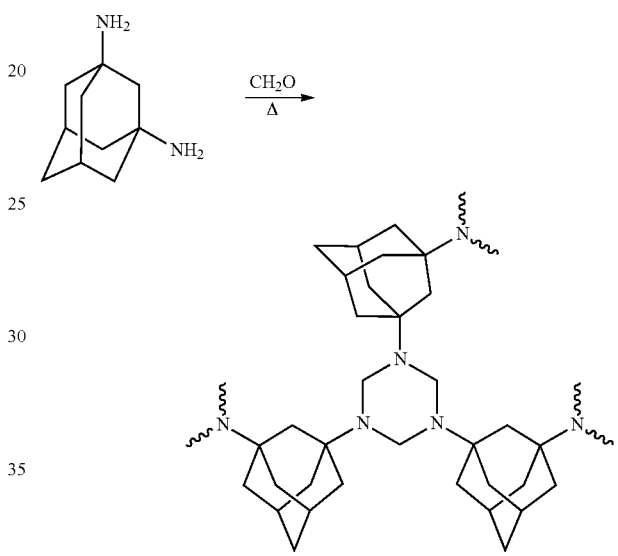

Advantageously, PHT networks containing adamantane ring structures and other ring structures such as norborane diamine ring structures, may produce PHT networks with greater free volume, which may result in a lower dielectric constant. This is because the polycyclic ring structures are bulky and take up space within a polymer network where rotational and translational movements are restricted. The large polycyclic structures may also interrupt local and long range molecular packing and crystallization, which may also create more network free volume.

Generally, the cyclic aliphatic amine chemical group may be at least one covalent ring structure or multiple covalent ring structures (polycyclic), and may further comprise of bridging groups, polymeric segments, and other chemical functionality, aromatic and/or aliphatic. In some embodiments, the low-k PHT network may contain a mole fraction of aromatic groups based on polymer, to increase the modulus and stiffness, but without increasing the overall k value significantly. More specifically, to maintain a dielectric constant of less than 5, less than 50% by mole aromatic structures based on polymer may be introduced into the network, without raising the dielectric constant by more than about 0.5 to about 1.0. In one embodiment, as illustrated by reaction example 3, a polycyclic diamine containing both aliphatic and aromatic structures is reacted with PF to produce a PHT network with an increased modulus:

Reaction Example 3

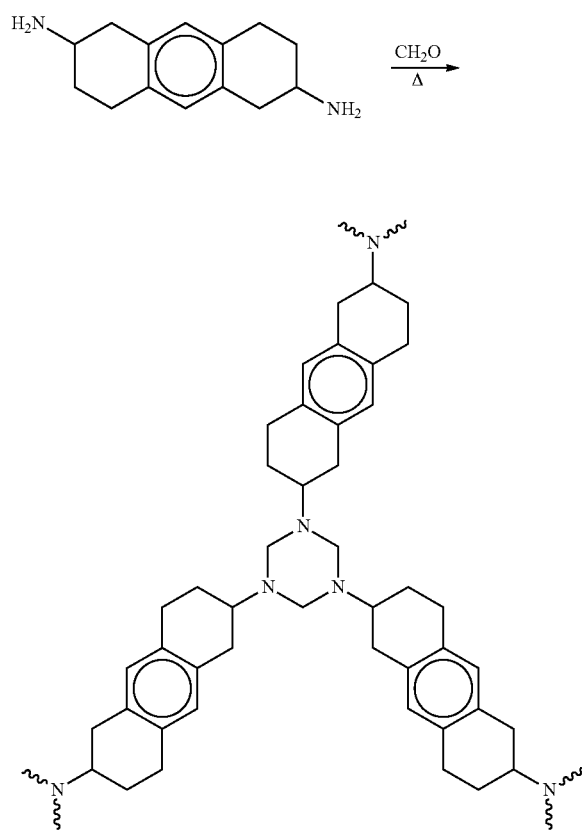

Reaction Example 4

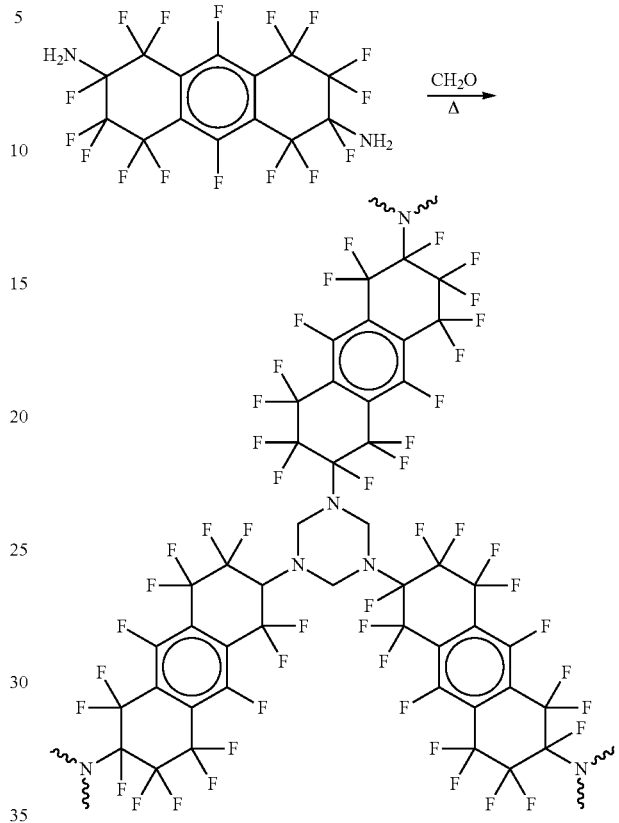

In another embodiment, a PHT network comprising both aliphatic and aromatic ring structures may be produced with a mixture comprising cyclic aliphatic diamines such as DCH and aromatic amines such as ODA with PF. It is noted that those skilled in the art may use any number of non-limiting combinations of aliphatic and aromatic ring structures to produce low-k PHTs. For example, polycyclic diamines such as adamantanediamine and norbornanediamine may also be combined with aromatic diamines such as ODA and paraphenylenediamine in proper proportions as noted above, to produce low-k PHT's.

The practitioner may choose to reduce the polarizability of PHTs further by the use of covalently bonded fluorine atoms. For example, a PHT network containing fluorine may be produced with an amine comprising structures and chemical groups that contain covalently bonded fluorine atoms. Advantageously, C—F bonds in a chemical structure may lower the k value of the molecule or polymer because C—F bonds have a lower polarizability than C—H bonds, and in aromatic structures, C—F bonds may lower the polarizability of pi electrons. Additionally, fluorine containing polymers repel high-k polar water molecules due to their lower surface energies. One non-limiting example of a fluorinated PHT is illustrated in reaction example 4, wherein a fluorinated difunctional amine is reacted with PF to produce a fluorinated low-k PHT with a k value that may be from about 2.5 to about 3.5.

Generally, the PHA or PHT network may comprise of chemical functionality and/or chemical groups that may engage in other chemical reactions, transformations, or interactions, before, during or after the formation of a PHT network or polymer, including, but not restricted to: synthesis, decomposition, single replacement and double replacement, oxidation/reduction, acid/base, nucleophilic, electrophilic and radical substitutions, and addition/elimination reactions. In some embodiments, the cyclic segments that bridge hexahydrotriazine groups may engage in polymerization reactions such as condensation, step growth, chain growth and addition polymerizations. In other embodiments, reactive chemical groups or other reactive matrix functionality may undergo further chemical reactions, as initiated by heat or light, or other means such as nucleophilic or electrophilic attack, or by free radical mechanisms of bond formation. In one non-limiting example, residual double bonds in the polymeric structure may be further reacted to create cross-links using free radical chemistry, such as that initiated by azo, inorganic and organic peroxides. In other embodiments, thermally induced cyclization or rearrangement reactions may be used to form chemical bonds and cross-links that may increase the modulus of the PHT network. In other embodiments some PHT matrix chemical groups may be more polar in nature, or may have a hydrophilic/lipophilic balance that is adjusted by the practitioner for certain properties, such as modulus, adhesive strength, and control of water absorption for example. The pendant group may be a hydrogen bonding pendant group, such as hydroxyl, which may engage in hydrogen bonding with a polar component in a composite material, such as reinforcing fiber or mineral filler. In some embodiments an interaction of this type may lead to increased adhesion of the PHT to a polar component and result in less cracking.

The following describes non-limiting chemical reaction conditions and procedures for the preparation of low-k PHAs and PHTs comprising covalently bound cyclic aliphatic chemical groups:

(1) The solvent may be a multifunctional cyclic aliphatic amine or other amines. Alternatively, a co-solvent may be used, including dipolar aprotic solvents such as, for example, N-methyl-2-pyrrolidone (NMP), dimethylsulfoxide (DMSO), N,N-dimethylformamide (DMF), N,N-dimethylacetamide (DMA), propylene carbonate (PC), and propylene glycol methyl ether acetate (PGMEA).

(2) Under inert dry conditions, a reaction vessel containing PF may be charged with the amine(s), amine solvents, and/or co-solvent(s) in the appropriate stoichiometric ratio, so that the moles of PF are sufficient to form PHA/PHT hexahydrotriazine structures, such as a ratio 1.25 mole PF to 0.5 mole amine. The reaction mixture may also comprise a mixture of different aliphatic and/or aromatic amines for hexahydrotriazine formation, in some combination. For example, the mixture may contain two amines, such as ODA (an aromatic bridging diamine) and the cyclic aliphatic difunctional amine, 1,4-diaminocyclohexane (DCH). Specifically, multifunctional amines may be used to create covalently PHA and PHT structures, but, if suitable or so desired, monoamines may also be used at some stoichiometric proportion. The well stirred reaction mixture may be then heated from about 30° C. and about 50° C. to cause the reaction of the amines with PF, and thus produce a PHA material over a time period from about 0.5 hours to about 2 hours. In another embodiment, DCH and PF in the proper stoichiometric ratio are reacted for 1 hour at 50 C to create a mixture comprising PHA. In these embodiments and others, the PF serves as a "thermal latent curing agent", that is, it does not undergo reaction with the amines to form hexahydrotriazine structures until heated. In some embodiments the reaction mixture may be cooled, or quenched, so that a reaction mixture of a desired viscosity is obtained and isolated, and wherein the mixture may comprise of PHA oligomers, polymers, and unreacted PF. Such a mixture may be suitable for coating substrates, followed by further heating to produce a desired state of cure.

In other embodiments the PHA material may not be isolated, and a PHT product may be formed directly, wherein the reaction mixture may heated from about 190° C. to about 210° C. for a period of time of about 1 minute to about 24 hours, and more preferably about 1 hour. In one non-limiting example a PHT thin film may be isolated by depositing an aliquot of the reaction mixture solution onto a substrate, such as a glass microscope slide with aluminum tape (80 μm thickness) boundaries using a glass Pasteur pipette. The following thermal treatment may be used to drive off non-reactive co-solvent and cure the film: a) 50° C. for about 1 hour, b) 50° C. to 110° C. for about 1 hour, c) 110° C. for about 1 hour, d) 110° C. to 200° C. for about 1 hour, and then 200° C. for about 1 hour, followed by cooling to ~23° C. In another embodiment, the thermal treatment may be as follows: a) 50° C. for about 1 hour, b) 50° C. to 200° C. over a time period of about 1 hour, c) 200° C. for about 1 hour, followed by cooling to ~23° C.

Figure 2:
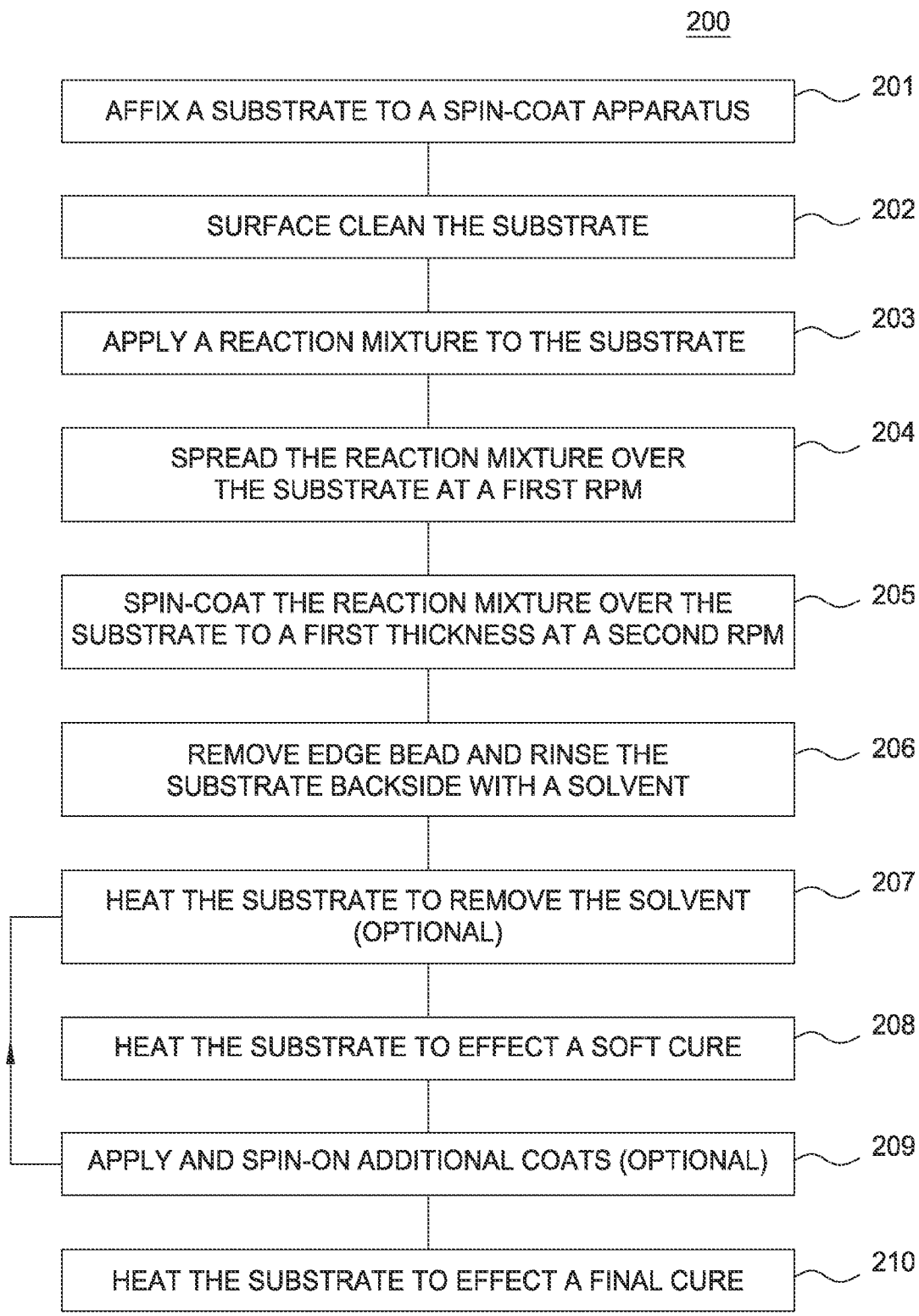
FIG. 2 is a flowchart depicting steps associated with an exemplary method 200 for application of a spin-on dielectric material according to one embodiment of the disclosure.

In one embodiment the reaction mixture may be used as a spin-on interlevel dielectric used in ICs, as illustrated in cross-section in FIG. 1, showing a dielectric between metal lines and vias in a 4 level wiring scheme. FIG. 2 is a flowchart depicting steps associated with a method 200 used to form a dielectric film on a silicon wafer substrate, and to ultimately produce a structure like that shown in FIG. 1. At 201, a patterned silicon wafer comprising a plurality of electrical circuitry and components used to create a plurality of ICs is affixed to a spin coater chuck. Then, at 202, the wafer may be cleaned to remove dust, particulates and other contaminants using ultra pure inert gas and/or appropriate solvents. At 203, a reaction mixture of a first viscosity that may comprise of combinations of monomers, solvent, oligomers and polymers of PHA, is dispensed and thus applied to the center of the wafer. It is further noted that those skilled in the art may produce a reaction mixture of a first viscosity by heat treatment of the reaction mixture as described prior, such as a well stirred reaction mixture that is heated from about 30° C. and to about 60° C., so as to cause the reaction of amine(s) with PF, and thus produce a PHA material over a time period from about 0.5 hours to about 2 hours. At 204 the mixture is spread, or spun over and upon the substrate at a first RPM, and at 205, the mixture is further spread or spun over the substrate at a second RPM, or a schedule of increasing RPM values to create a first film thickness. At 206, an edge bead may be removed and the wafer backside may be cleaned using an appropriate solvent. 207 involves heating the substrate on a hot plate or another appropriate heated surface to remove solvents and/or co-solvents. At 208, a soft cure is performed wherein more PHA extended structure is produced within the film and the PHA formation is substantially completed, such as about 75% percent to about 100% completion. At this juncture, the wafer may be handled if so desired, as the film viscosity has been increased so that the film is in a near solid state or a solid state and thus will not run easily. At 209, an additional coat may be applied as needed to build the film thickness further, and 209 may be repeated as deemed necessary to create a final thickness, in conjunction with steps 207 and 208. Finally, at 210, the substrate comprising a final thickness of PHA is heated per the following schedule to produce a PHT film: a) 110° C. to about 200° C. for about 1 hour, and then 200° C. for about 1 hour, followed by cooling to ~23° C. We note that the above Method 200 is a non-limiting example of a method used to produce a low-k PHT interlevel dielectric thin film on a substrate or wafer.

A composite article such as a PCB dielectric substrate may also be produced using the aforementioned reaction mixture. Here, a first viscosity mixture is produced by heat treatment of the reaction mixture as described prior, such as a well stirred reaction mixture that is heated from about 30° C. and to about 60° C., so to cause the reaction of the amine(s) with PF, and thus produce a mixture comprising PHA oligomers and polymers over a time period from about 0.5 hours to about 2 hours, and so that a desired working viscosity is obtained. The mixture may be then applied to a fiber mat or matrix, such as that produced from fiberglass or carbon fiber, and thus impregnating the fiber mat with the partially cured mixture. The fiberglass mat thus obtained may be known as a polymer pre-impregnated mat (pre-preg). At this juncture, excess partially cured resin and other components may be removed from the prepreg by a squeegee, and then the prepreg may be subjected to further heat to achieve a certain desired stage of cure, followed by cooling to stop the chemical reaction(s), and so that the material may be handled. This composite precursor article may be termed a "B-stage" prepreg, wherein the resin mixture is partially cured, maintains some flexibility, and may be handled for further transport of processing. The B-stage prepreg may comprise of PF, PHA oligomers and polymers and other reaction components. At this stage the B-stage prepreg may be used to create a composite article in a mold. The article may be produced by further heating to about 200° C. in a vacuum autoclave to complete the reaction of the amine components with the thermal latent PF in the mixture, remove solvent, and thus produce a composite with PHT matrix resin.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A method of producing a composite article, comprising:
   forming a mixture comprising a solvent, amines, and paraformaldehyde, and;
   heating the mixture to a first temperature to produce a first partially cured mixture of a first viscosity;
   coating a work piece with the first partially cured mixture of the first viscosity to produce polymer impregnated fibers (prepreg);
   heating the prepreg to a second temperature to produce a B-stage prepreg of a second viscosity;
   cooling the B-stage prepreg;
   forming an article from the B-stage prepreg; and
   heating the article at a temperature from about 150° C. to about 280° C. to form a fully cured composite containing polyhexahydrotriazine, wherein the amines of the mixture comprise at least 50% by mole cyclic aliphatic amine based on polymer.

2. The method of claim 1, wherein the amines of the mixture comprise of less than 50% by mole aromatic amine based on polymer.

3. A method of producing a composite article, comprising:
   forming a mixture comprising a solvent, amines, and paraformaldehyde, and;
   heating the mixture to a first temperature to produce a first partially cured mixture of a first viscosity;
   coating a work piece with the first partially cured mixture of the first viscosity to produce polymer impregnated fibers (prepreg);
   heating the prepreg to a second temperature to produce a B-stage prepreg of a second viscosity;
   cooling the B-stage prepreg;
   forming an article from the B-stage prepreg; and
   heating the article at a temperature from about 150° C. to about 280° C. to form a fully cured composite containing polyhexahydrotriazine, wherein the first partially cured mixture of the first viscosity is produced at a temperature from about 20° C. to about 40° C. and the first partially cured mixture of the first viscosity comprises covalently bonded cyclic aliphatic chemical groups and PHA oligomers and polymers.

4. The method of claim 1, wherein the B-stage prepreg of the second viscosity is produced at a temperature from about 40° C. to about 145° C.

5. The method of claim 3, wherein the B-stage prepreg of the second viscosity comprises covalently bonded cyclic aliphatic chemical groups and PHA oligomers and polymers.

6. The method of claim 1, wherein the cyclic aliphatic amines include diamines.

7. The method of claim 1, wherein the cyclic aliphatic amines include polycyclic ring structures.

8. The method of claim 1, wherein the cyclic aliphatic amines include bicyclic structures.

9. The method of claim 1, wherein the amines of the mixture comprise one or more polycyclic diamines containing aliphatic and aromatic structures.

10. The method of claim 3, wherein the amines of the mixture include diamines.

11. The method of claim 3, wherein the amines of the mixture include polycyclic ring structures.

12. The method of claim 3, wherein the amines of the mixture include bicyclic structures.

13. The method of claim 3, wherein the amines of the mixture comprise one or more polycyclic diamines containing aliphatic and aromatic structures.

14. The method of claim 1, wherein the amines of the mixture include cyclic aliphatic diamines and aromatic amines.

* * * * *